United States Patent [19]

McPherson

[11] Patent Number: 4,587,594
[45] Date of Patent: May 6, 1986

[54] ELECTRICAL CIRCUIT ASSEMBLIES

[75] Inventor: Hugh McPherson, West Linton, Scotland

[73] Assignee: Ferranti, PLC, Cheshire, England

[21] Appl. No.: 504,321

[22] Filed: Jun. 14, 1983

[30] Foreign Application Priority Data

Jun. 19, 1982 [GB] United Kingdom ............... 8217817

[51] Int. Cl.⁴ .............................................. H05K 7/20
[52] U.S. Cl. .................................... 361/383; 361/386; 361/412
[58] Field of Search ............... 361/383, 384, 412, 413, 361/415, 396, 387, 386; 339/17 LM, 17 M

[56] References Cited

U.S. PATENT DOCUMENTS

| 2,931,003 | 3/1960 | Huetten | 361/412 |
| 3,406,368 | 10/1968 | Curran | 361/413 |
| 3,684,943 | 8/1972 | Demarest | 361/383 |
| 3,691,432 | 9/1972 | Edfors et al. | 361/384 |
| 3,829,598 | 8/1974 | Darnell | 361/386 |
| 4,103,737 | 8/1978 | Perkins | 361/386 |

FOREIGN PATENT DOCUMENTS

| 0026443 | 4/1981 | European Pat. Off. |  |
| 0031419 | 7/1981 | European Pat. Off. |  |
| 1493471 | 7/1967 | France | 361/412 |
| 1150725 | 8/1961 | German Democratic Rep. | 361/412 |
| 1324574 | 4/1971 | United Kingdom |  |
| 1418417 | 5/1973 | United Kingdom |  |
| 1326972 | 8/1973 | United Kingdom |  |
| 1336076 | 11/1973 | United Kingdom |  |
| 1573056 | 1/1977 | United Kingdom |  |
| 1491589 | 11/1977 | United Kingdom |  |
| 2025144 | 1/1980 | United Kingdom |  |
| 2052164 | 1/1981 | United Kingdom |  |

Primary Examiner—A. D. Pellinen
Assistant Examiner—Gregory D. Thompson
Attorney, Agent, or Firm—Dennis P. Clarke

[57] ABSTRACT

An electrical circuit assembly uses a plurality of stacks upon a generally planar support. Each constituent stack has a plurality of modules having planar substrates extending at right angles to a longitudinal axis of symmetry of the stack. The axis of symmetry is perpendicular to the generally planar support and various electrical interconnections extend between adjacent substrates parallel to this axis. Electrical circuit elements are mounted upon the substrates and the substrates are spaced to facilitate flow of cooling fluid, such as air, between the substrates. Heat conducting fins may be mounted on the substrates. To facilitate flow of cooling fluid, stacks of substrates are staggered or offset from substrates of an adjacent stack. A plurality of the electrical circuit assemblies may be combined together.

19 Claims, 6 Drawing Figures

ELECTRICAL CIRCUIT ASSEMBLIES

BACKGROUND OF THE INVENTION

THIS INVENTION relates to electrical circuit assemblies, and in particular to electrical circuit assemblies each comprising a plurality of stacks on a common, at least generally, planar support, each constituent stack having a plurality of at least substantially identically constructed modules, each such module including an, at least substantially, planar substrate, extending at right angles to the longitudinal axis of symmetry of the associated stack, the assembly having circuit elements mounted on at least one major surface of each substrate, and electrical interconnections are provided between the constituent modules of each stack, and between each constituent stack, to complete a required circuit. The circuit elements on any substrate may include conductors interconnecting circuit elements comprising components, such as packaged, or unencapsulated, semiconductor devices, also provided on the substrates.

The constituent stacks of such an electrical circuit assembly may be secured to the associated common support in any convenient way.

The constituent modules of each stack may be secured, in their desired locations within the stack, in any convenient way. Usually, a plurality of members are provided, extending parallel to the longitudinal axis of symmetry of the stack, and, at least partially, holding the modules in their required locations within the stack, each substrate co-operating with the members in any convenient way. Additional securing means, of any convenient form, may be provided for the stack. In any such arrangement, the provision of the members is advantageous, the members being capable of readily holding the modules in their required locations in the stack, during the assembling of the stack.

It may be desirable that faulty modules are readily replaceable, and, in particular, that the modules are resiliently held by the members within the associated stack.

Further, the electrical interconnections provided between the modules within each constituent stack may have any convenient form, and may comprise, at least some of, the members, at least partially, holding the modules in their required locations in the stack. Hence, the electrical interconnections may comprise, at least part of, the means securing the modules in the stack.

Terminals may be provided for each constituent stack of the electrical circuit assembly in any convenient way, and may comprise constituent circuit elements on at least one major surface of at least one substrate, and/or end portions of electrical interconnections provided between the modules, and comprising members, at least partially, holding the modules in their required locations in the stack.

In complex electrical circuit assemblies, having densely packed modules, and/or circuit elements on the modules, it is a problem to remove generated heat, before such heat can cause damage to the electrical circuit assemblies. Usually the heat is generated by some of the constituent components of the electrical circuit assemblies, but possibly, and conveniently, the heat is removed from adjacent circuit elements, such as conductors connected thereto; and/or from the substrates, when the substrates are of a material with a high coefficient of thermal conduction, the substrates possibly comprising heat sinks, with the circuit elements mounted thereon.

SUMMARY OF THE INVENTION

It is an object of the present invention to provide an electrical circuit assembly, comprising a plurality of stacks on a common, at least generally, planar support, each constituent stack having a plurality of at least substantially identically constructed modules, each such module including an, at least substantially, planar substrate, extending at right angles to the longitudinal axis of symmetry of the associated stack, the assembly having circuit elements mounted on at least one major surface of each substrate, and to points of which electrical circuit assembly where generated heat is required to be removed, a cooling fluid, such as air, can be supplied easily and efficiently.

According to the present invention an electrical circuit assembly comprises a plurality of stacks on a common, at least generally, planar support, each constituent stack having a plurality of at least substantially identically constructed modules, each such module, at least partially, being held in its required location in the associated stack by a plurality of members extending parallel to the longitudinal axis of symmetry of, and at least wholly along, the stack, each module including an, at least substantially, planar substrate, the substrate extending at right angles to the longitudinal axis of symmetry of the stack, the longitudinal axis of symmetry of each stack being at right angles to the, at least general, plane of the common support, the assembly having constituent elements of a circuit on at least one major surface of each substrate, the circuit being completed by electrical interconnections between the modules of each stack, and between each constituent stack, terminals are provided for each constituent stack of the electrical circuit assembly, and in each stack adjacent pairs of substrates are spaced apart, the arrangement being so that a cooling fluid can flow between the adjacent pairs of substrates, through each stack, in planes generally at right angles to the longitudinal axes of symmetry of the stacks, and the cooling fluid can flow, sequentially, through at least two of the constituent stacks.

By the flow of the cooling fluid over the circuit elements, and/or by the flow of the cooling fluid over the substrates, especially when the substrates are of a material with a high coefficient of thermal conduction, heat is removed from the electrical circuit assembly.

The cooling fluid may be air.

Usually, for each stack, the constituent substrates of the stack are identical.

Any conductors, or terminals, comprising circuit elements provided within the modules, may be formed in any convenient manner, for example, by employing known thick film techniques.

The components, such as semiconductor devices, provided within the modules, may have any form, and may be mounted on the substrates in any known way.

A plurality of at least substantially indentically constructed stacks may be included in the assembly.

Conveniently, in relation to at least an adjacent pair of stacks of the electrical circuit assembly, the arrangement being such that through both stacks of the adjacent pair the cooling fluid is to flow in turn, the constituent spaced substrates of one stack of the adjacent pair are in staggered relationship to the constituent spaced substrates of the other stack of the adjacent pair.

A plurality of at least substantially identically constructed stacks may be included in the assembly.

For a constituent stack, it may not be essential that the cooling fluid is to flow over each module; and/or the flow of cooling fluid through the stack may be regulated, so that the cooling effect is greater for some modules, in relation to a lesser cooling effect for the other modules.

When circuit elements are provided on only one major surface of each of, at least some of, the substrates, adjacent pairs of such substrates of a stack may be arranged so that the circuit elements are provided on opposing major surfaces thereof. In addition, the arrangement may be such that the cooling fluid is to flow between alternate adjacent pairs of such substrates of a stack, either directly over the circuit elements, or only over major substrate surfaces not bearing circuit elements. Hence, alternate adjacent pairs of substrates may not be spaced apart.

Conveniently, within a stack, spaced apart adjacent pairs of substrates are separated by a uniform distance.

Also, for a stack, when circuit elements are provided on only one major surface of each of, at least some of, the substrates, and the substrates are of a material with a high coefficient of thermal conduction, possibly comprising heat sinks, a heat conducting member may be provided on the other major substrate surface, the arrangement being such that the cooling fluid is to flow over the heat conducting member, and extracts heat therefrom, the heat conducting member being so shaped that the cooling fluid is to flow over an extensive surface area thereof, for example, each heat conducting member being formed with fins. When adjacent pairs of such substrates are arranged so that the circuit elements are provided on opposing major surfaces thereof, the heat conducting members provided, on the other major substrate surfaces, of alternate adjacent pairs of such substrates, may be interdigitated with each other, forming passages for the cooling fluid therebetween.

Alternatively, circuit elements are provided on both major surfaces of each of, at least some of, the substrates, and components generating heat may be provided on both major surfaces of, at least some of, the substrates.

As indicated above, at least some of, the electrical interconnections may comprise members, at least partially, holding the modules in their required locations within the associated stack, and end portions thereof may comprise terminals of the stack. Alternatively, or in addition, at least some of, the electrical interconnections are provided by, and comprise parts of, members, at least partially, holding the modules in their required locations within the stack, each such member including an electrically insulating support for the associated electrical interconnections.

Members, at least partially, holding the modules in their required locations within the associated stack, and possibly comprising electrical interconnections provided between the modules, may be arranged not to cause any significant restriction to the flow of cooling fluid along any desired direction through the stack. For example, when each module substrate is square shaped, or rectangular shaped, in plan, and the stack is, respectively, square shaped, or rectangular shaped, in cross-section, such members, at least partially, holding the modules in their required locations within the stack, and not comprising electrical interconnections provided between the modules, each comprises a corner piece for the stack. Alternatively, two planar members are provided to prevent the flow of cooling fluid through two associated, opposing, surfaces of the associated stack. At least some of, the electrical interconnections between the modules are provided by, and comprise parts of, such planar members, at least partially, holding the modules in their required locations within the stack, each such member including an electrically insulating support for the associated electrical interconnections.

The arrangement for a stack may be such that the flow of cooling fluid is to be through spaces left between, at least some of, the electrical interconnections between the associated modules, the cooling fluid flow not being significantly restricted thereby; and, in any arrangement, the electrical interconnections, alone, do not cause any significant restriction to the flow of cooling fluid along any desired direction through the stack.

The common support of the electrical circuit assembly may be a printed circuit board, terminals of each stack being connected electrically to the printed circuit board, the printed circuit board providing the required electrical interconnections between the stacks to complete the circuit.

An electrical circuit assembly in accordance with the present invention may comprise a less complex electrical circuit assembly, terminals of the less complex electrical circuit assembly being connected to other constituent parts of a more complex electrical circuit assembly, the other parts of the more complex electrical circuit assembly each having any required form.

According to another aspect of the present invention a more complex electrical circuit assembly comprises the combination of a plurality of less complex electrical circuit assemblies, each constituent, less complex, electrical circuit assembly having a construction of any of the forms referred to above, and the less complex electrical circuit assemblies are mounted on a common, at least generally, planar mother support, a circuit embodied within the combination being completed by electrical interconnections between the constituent, less complex, electrical circuit assemblies, terminals being provided for each constituent electrical circuit assembly, and the mother support extends at right angles to the, at least generally, planar support of each constituent electrical circuit assembly, the supports of the constituent electrical circuit assemblies extending parallel to each other, the arrangement being such that the cooling fluid provided to the combination is divided to flow, generally parallel to the plane of the mother support, through each constituent electrical circuit assembly.

The mother support may comprise a printed circuit board, the terminals of each constituent electrical circuit assembly being connected electrically to the mother printed circuit board, the mother printed circuit board providing the required electrical interconnections between the electrical circuit assemblies to complete the circuit embodied within the combination. A connector may be provided individually between each constituent electrical circuit assembly and the mother printed circuit board.

A plurality of at least substantially identically constructed electrical circuit assemblies may be included in the combination.

BRIEF DESCRIPTION OF THE DRAWING

The present invention will now be described by way of example with reference to the accompanying drawings, in which.

DETAILED DESCRIPTION

Figure 1:
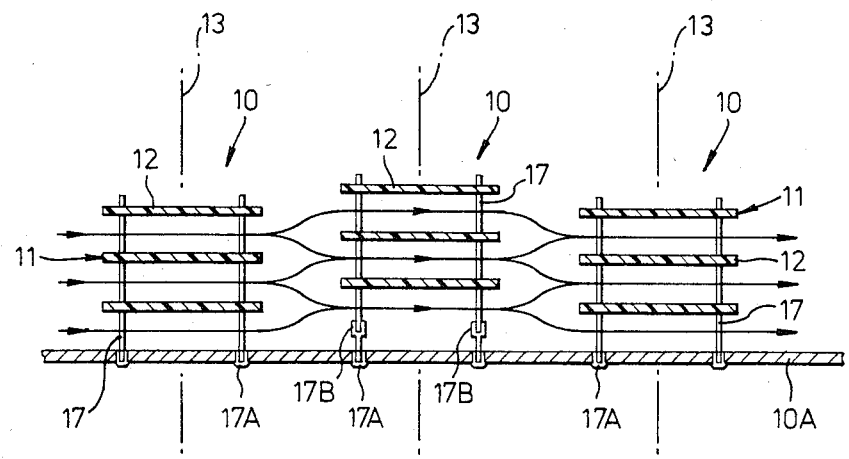
FIG. 1 is a cross section of one embodiment of an electrical circuit assembly comprising a plurality of stacks on a common support, each stack having a plurality of at least substantially identically constructed modules, and, in accordance with the present invention, is arranged such that a cooling fluid is to flow, sequentially, through at least two of the constituent stacks of the electrical circuit assembly.
Figure 2:
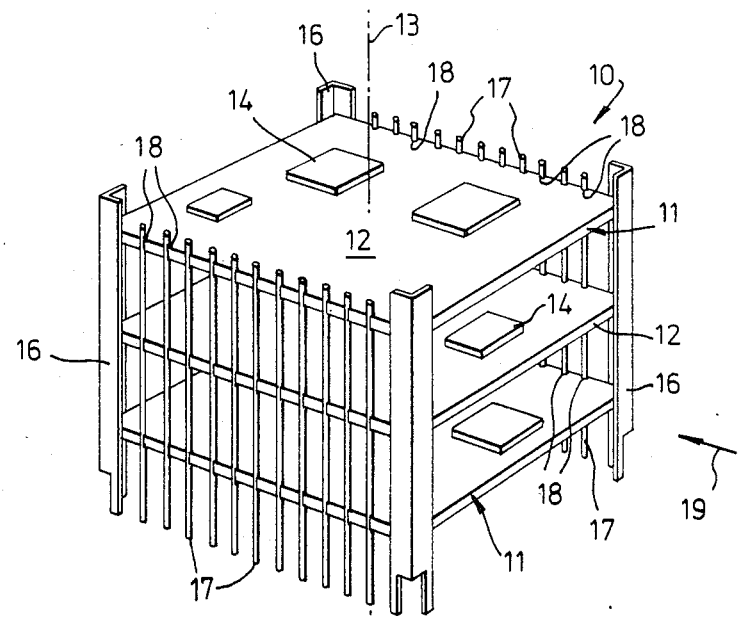
FIG. 2 is a perspective view of one embodiment of a constituent stack of the electrical circuit assembly of FIG. 1.

The electrical circuit assembly shown partially in FIG. 1 comprises a plurality of stacks 10 on a common, planar support 10A, each stack being as shown in FIG. 2, having a plurality of at least substantially identically constructed modules 11. Each module 11 includes a planar substrate 12 of electrical insulating material, such as alumina, and is square shaped in plan. Thus, each stack 10 is square shaped in cross section, the substrates 12 extending at right angles to the longitudinal axis of symmetry 13 of the stack 10. Circuit elements are mounted on one major surface of each substrate 12, the circuit elements including components 14, such as packaged, or unencapsulated, semiconductor devices, mounted on the substrates in any convenient manner, and connected to circuit elements in the form of conductors (not shown). For modules 11 at either extremity of each stack, circuit elements comprising terminals (not shown), for the associated stack, may be provided within such modules. Circuit elements provided within the modules may be formed in any convenient way, for example, conductors and terminals being provided by employing thick film techniques. Other kinds of circuit elements also may be provided in any convenient way within the modules.

The terminals for the stacks, and not comprising circuit elements on the substrates, may have any required construction.

In the form of stack shown in FIG. 2, and suitable for inclusion in the electrical circuit assembly of FIG. 1, the constituent circuit elements of each module, except one module, at one extremity of the stack, are opposite to a major surface of the substrate of an adjacent module within the stack, this adjacent, major substrate surface not bearing circuit elements.

Within the stack, each adjacent pair of substrates are separated by a uniform distance.

Members 16, at least partially, holding the modules 11 in their required locations within the stack 10, each comprise a corner piece for the, square shaped in cross-section, stack, the corner pieces extending parallel to the longitudinal axis of symmetry 13 of the stack. The members 16 co-operate with the module substrates 12 in any convenient way, for example, being a press fit within co-operating pairs of flanges (not shown), of any convenient construction, and provided by each of the members, each member providing a co-operating pair of flanges for each substrate. The substrate, possibly, also is soldered to the flanges.

Electrical interconnections 17 are provided between the constituent modules 11 of the stack 10, to complete the associated part of a required circuit. The illustrated electrical interconnections 17 each comprise a member, at least partially, holding the modules in their required locations within the stack, and extending parallel to the longitudinal axis of symmetry of the stack. The end portions of such electrical interconnections 17 may comprise terminals of the stack. The electrical interconnections 17 are secured to the module substrate 12 in any convenient way, for example, being secured in aligned bores extending through the substrates, and possibly decoupled from the modules by discoidal capacitors; or, as shown, the electrical interconnections being secured in aligned notches 18 formed in the substrate peripheries; or each such electrical interconnection comprising flexible strip material, provided with pairs of resilient flanges, for example, by bending the strip, and to engage the module substrates, and possibly being soldered to the substrates. In any such arrangement, the electrical interconnections comprise part of the means securing the modules in the stack. With electrical interconnections of any such form, the corner piece members 16 may be omitted. However, desired electrical interconnections between the modules may have any convenient form, and, at least some of, the electrical interconnections may not comprise members, at least partially, holding the modules in their required locations within the stack, and, for example, may comprise resilient U-shaped members, each co-operating with only two adjacent modules within the stack.

For each module at extremities of the stack, and provided with terminals for the stack, the terminals each may be substantially of the same form as the U-shaped electrical interconnections provided between the modules, but instead of being U-shaped, the terminals are provided with lugs to co-operate with sockets provided by members external of the stack.

In complex electrical circuit assemblies, having densely packaged modules, and/or circuit elements on the modules, it is a problem to remove generated heat. Usually the heat is generated by some of the constituent components of the electrical circuit assemblies, but possibly, and conveniently, the heat is removed from adjacent circuit elements, such as conductors connected thereto.

In accordance with the present invention, heat is removed from the electrical circuit assembly by adjacent pairs of substrates of each constituent stack being spaced apart, and by causing a cooling fluid, such as air, to flow between the spaced adjacent pairs of substrates in each stack, through the stacks, in planes at right angles to the longitudinal axes of symmetry of the stacks, and is to flow, in turn, through more than one of the constituent stacks. In the illustrated arrangement of a stack shown in FIG. 2, the cooling fluid flows over the circuit elements. The arrangement is such that the cooling fluid can be supplied easily, and efficiently, to flow over points of the electrical circuit assembly where generated heat is required to be removed.

The arrangement of a stack shown in FIG. 2 is such that there is no significant restriction in the flow of cooling fluid through the stack in the direction of the arrow 19, from a plenum chamber (not shown). In particular, the corner piece members 16, and the illustrated electrical interconnections 17, both comprising members, at least partially, holding the modules in their required locations within the stack, do not significantly restrict the flow of cooling fluid through the stack. Even if the flow of cooling fluid through the stack is at right angles to the arrow 19, there is no significant restriction in the flow through the spaces between the electrical interconnections 17. Similarly, if electrical interconnections, which are not members, at least partially, holding the modules in their required locations within the stack, are provided, there is no significant restriction in the flow of the cooling fluid through the spaces between such electrical interconnections.

The common support 10A of the electrical circuit assembly, shown in FIG. 1, comprises a conventional printed circuit board, providing the required electrical interconnections between the stacks to complete the circuit embodied in the electrical circuit assembly, and the longitudinal axis of symmetry 13 of each stack extending at right angles to the plane of the printed circuit board 10A. Thus, each stack of FIG. 1 has electrical interconnections provided between the modules each comprising a member, at least partially, holding the modules in their required locations within the stack, and end portions of the electrical interconnections 17 comprise terminals in the form of plugs, arranged to be inserted into co-operating terminals 17A, in the form of sockets, of the electrical interconnections provided by the printed circuit board 10A. That is, the lower ends of interconnections 17 act as plugs. Further, end portions of the corner piece members of each stack are formed into lugs, arranged to be inserted into co-operating sockets provided by the printed circuit board, so that the stack is supported by the printed circuit board 10A. For convenience, the corner pieces 16 of the stack, and the components 14, are not shown in FIG. 1. The cooling fluid flows in turn through the illustrated stacks, as indicated by the arrows 19. In addition, alternate stacks, as positioned in the direction of the cooling fluid flow, are mounted on spacing members indicated generally at 17B, on the printed circuit board. Thus, in relation to each adjacent pair of such stacks, the constituent spaced substrates of one stack are in staggered relationship to the constituent spaced substrates of the other stack, enhancing the cooling effect for the electrical circuit assembly.

Figure 3:
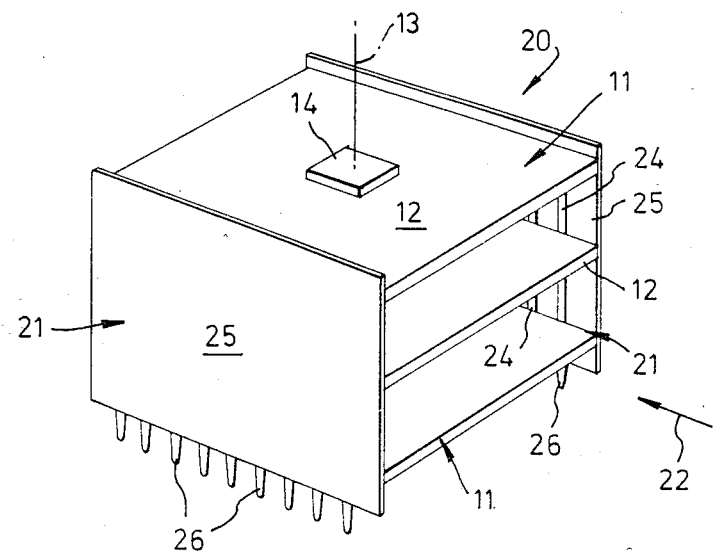
FIG. 3 is a corresponding view of another embodiment of a stack.

In the alternative form of stack 20 shown in FIG. 3, the members, at least partially, holding the modules 11 in their required locations within the, square shaped in cross section, stack, comprise two planar members 21, extending parallel to the longitudinal axis of symmetry 13 of the stack, and adjacent to two opposing sides of the stack. Thus, the flow of cooling air through the stack is restricted to a direction, indicated by the arrow 22, through the other two opposing sides of the stack, extending parallel to the longitudinal axis of symmetry 13 of the stack. Parts of the stack 20 of FIG. 3 identical with, or substantially resembling, parts of the stack 10 of FIG. 2, are identified by the same reference numerals in both Figures.

The planar members 21 cooperate with the module substrates 12 in any convenient way, for example, being a press fit within co-operating pairs of flanges (not shown), each member providing a co-operating pair of flanges for each substrate, and, possibly, the substrates 12 being soldered to the planar members 21.

The planar members 21 assist in enabling the stack to be handled without damage.

Electrical interconnections 24 are provided between the constituent modules 11 of the stack in any convenient manner. In the arrangement shown in FIG. 3, the electrical interconnections are provided as parts of the generally planar members 21, the planar parts 25 of the members 21 comprising electrically insulating supports for the electrical interconnections 24, the electrical interconnections comprising conductors formed on the electrically insulating planar parts 25. Other electrical interconnections, of any form, may be provided adjacent to the sides of the stack through which the cooling fluid flows, the cooling fluid flowing through spaces between such electrical interconnections, the electrical interconnections not significantly restricting the flow of the cooling field.

Circuit elements may be mounted on the planar parts 25.

Terminals 26 for the stack 20 are also provided within the members 21, the terminals comprising lugs mounted on the electrically insulating, planar parts 25 of the member 21, the lugs being connected directly to the electrical interconnections 24.

Instead of being of electrically insulating material, within any stack in an electrical circuit assembly in accordance with the present invention, the module substrates may be of a material with a high coefficient of thermal conduction, and may comprise heat sinks, heat being removed therefrom by the flow of cooling fluid over the modules.

Figure 4:
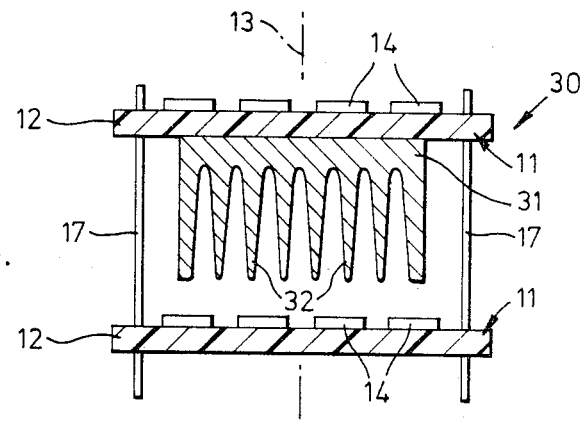
FIG. 4 is a cross sectional elevation of part of yet another embodiment of a stack, FIG. 5 corresponds to FIG. 4, and is of a modification of the stack of FIG. 4.

For the further form of stack 30, shown partially in FIG. 4, parts identical with, or closely resembling, parts of the stack 10 of FIG. 2, are identified by the same reference numerals in both Figures.

In the stack 30 of FIG. 4, circuit elements 14 are provided on only one major surface of each of, at least some of, the substrates, these substrates being of a material with a high coefficient of thermal conduction, and a heat conducting member 31 is provided on the other major substrate surface. The heat conducting member 31 has an extensive area, and in the illustrated arrangement the heat conducting member is formed with fins 32. The cooling fluid flows over the extensive surface area of the heat conducting member 31, and efficiently removes heat therefrom.

Figure 5:
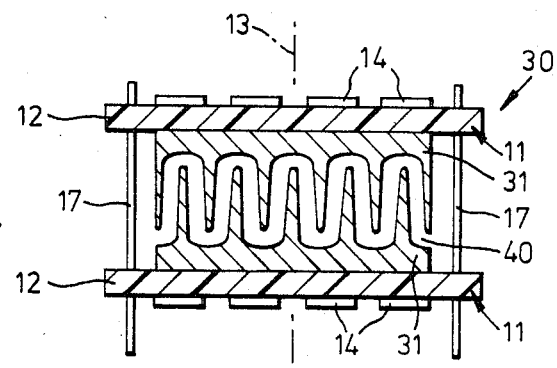

In the modified form of the stack 30 shown in FIG. 5, adjacent pairs of module substrates 12 are arranged so that the circuit elements 14 are provided on opposing major surfaces there within the stack 30. Hence, heat conducting members 31 provided on the other major substrate surfaces, of alternage adjacent pairs of such substrates, are directly opposite to each other. Conveniently, as illustrated, the opposing pairs of heat conducting members are arranged to be interdigitated with each other, forming passages 40 for the cooling fluid therebetween.

With any electrical circuit assembly, the arrangement may be such that the cooling fluid flows directly over the major substrate surfaces bearing the circuit elements. However, if the circuit elements are likely to be damaged by the flow of the cooling fluid, the arrangement may be such that the cooling fluid flows only over major substrate surfaces not bearing circuit elements, if the substrates are of a material with a high coefficient of thermal conduction.

Even if heat conducting members are not provided within the stacks of the electrical circuit assembly, when circuit elements are provided on only one major surface of each of, at least some of, the substrates, the arrangement may be such that the circuit elements are provided on opposing major surfaces thereof within the constituent stacks. The arrangement may be such that the cooling fluid flows only between alternate adjacent pairs of such substrates, either directly over the circuit elements, or only over major substrate surfaces not bearing circuit elements.

Alternatively, circuit elements are provided on both major surfaces of each of, at least some of, the substrates, and components generating heat may be provided on both major surfaces of, at least some of, the substrates.

In any arrangement for an electrical circuit assembly, in accordance with the present invention, the cooling fluid may not flow between some adjacent pairs of substrates of the constituent stacks, and possibly each such adjacent pair of substrates may not be spaced apart, especially if these substrates do not carry heat generating components.

In addition, or alternatively, the flow of cooling fluid through a stack may be regulated, so that the cooling effect is greater for some modules, in relation to a lesser cooling effect for the other modules. The flow of cooling fluid may be regulated by varying the speed of flow; and/or the mass; of the cooling fluid over a module, possibly by varying the distance separating adjacent pairs of substrates.

Conveniently, however, within a stack, spaced apart adjacent pairs of substrates are separated by a uniform distance.

The members, at least partially, holding the modules in their required locations within a stack, may have any convenient shape. Such members, including electrical interconnections provided between the modules and comprising such members, are advantageous, the members being capable of holding the modules during the assembling of the stack. It may be desirable that faulty modules are readily replaceable, and, in particular, that the modules are resiliently held by the members. Further, electrical interconnections, provided beteen the modules, and not comprising members, at least partially, holding the modules in their required locations within the stack, desirably are resiliently secured to the modules.

Otherwise the modules may be rigidly secured within a stack by the members, and by the electrical interconnections. For example, the members, and the electrical interconnections, may be of tinned copper, and are soldered to the module substrates in the completed stack.

Usually, additional securing means, of any known form, is provided for the stack.

The module substrates of the constituent stacks of the electrical circuit assembly may not be in staggered relationship to each other, as described above.

The module substrates, and/or the common support, may not be wholly planar in form, but extend generally in a plane.

The common support may have any convenient shape; and may not comprise a printed circuit board. The required electrical interconnections between the constituent stacks may be provided in any convenient way. The stacks may be secured to the common support in any convenient way.

The module substrates may be rectangular in plan, or have any other convenient shape.

There may be minor variations in the constructions of the constituent modules of the stacks of an electrical circuit assembly in accordance with the present invention.

Even though cooling fluid is to flow through a constituent stack, a casing may be provided for the stack.

A casing may be provided for the electrical circuit assembly.

The cooling fluid may be provided to, and/or extracted from, an electrical circuit assembly in any convenient manner.

An electrical circuit assembly in accordance with the present invention may comprise a less complex electrical circuit assembly, terminals of the less complex electrical circuit assembly being connected to other constituent parts of a more complex electrical circuit assembly. The other parts of the more complex electrical circuit assembly each may have any required form.

Another aspect of the present invention comprises a combination of a plurality of less complex electrical circuit assemblies mounted on a common support, and the combination comprises a more complex electrical circuit assembly than any constituent, less complex, electrical circuit assembly. Such an arrangement is shown partially in FIG. 6, only some of the constituent less complex electrical circuit assemblies being illustrated, but each constituent, less complex, electrical circuit assembly has the construction shown in FIG. 1, and described above, comprising a plurality of stacks 10 on a common support comprising a conventional daughter printed circuit board 10A. In the illustrated more complex electrical circuit assembly the common support 60 for the plurality of constituent, less complex, electrical circuit assemblies comprises a conventional mother printed circuit board. The plane of the mother printed circuit board 60 extends at right angles to the plane of each daughter printed circuit board 10A of the constituent, less complex, electrical circuit assemblies, and the daughter printed circuit boards extend parallel to each other.

Figure 6:
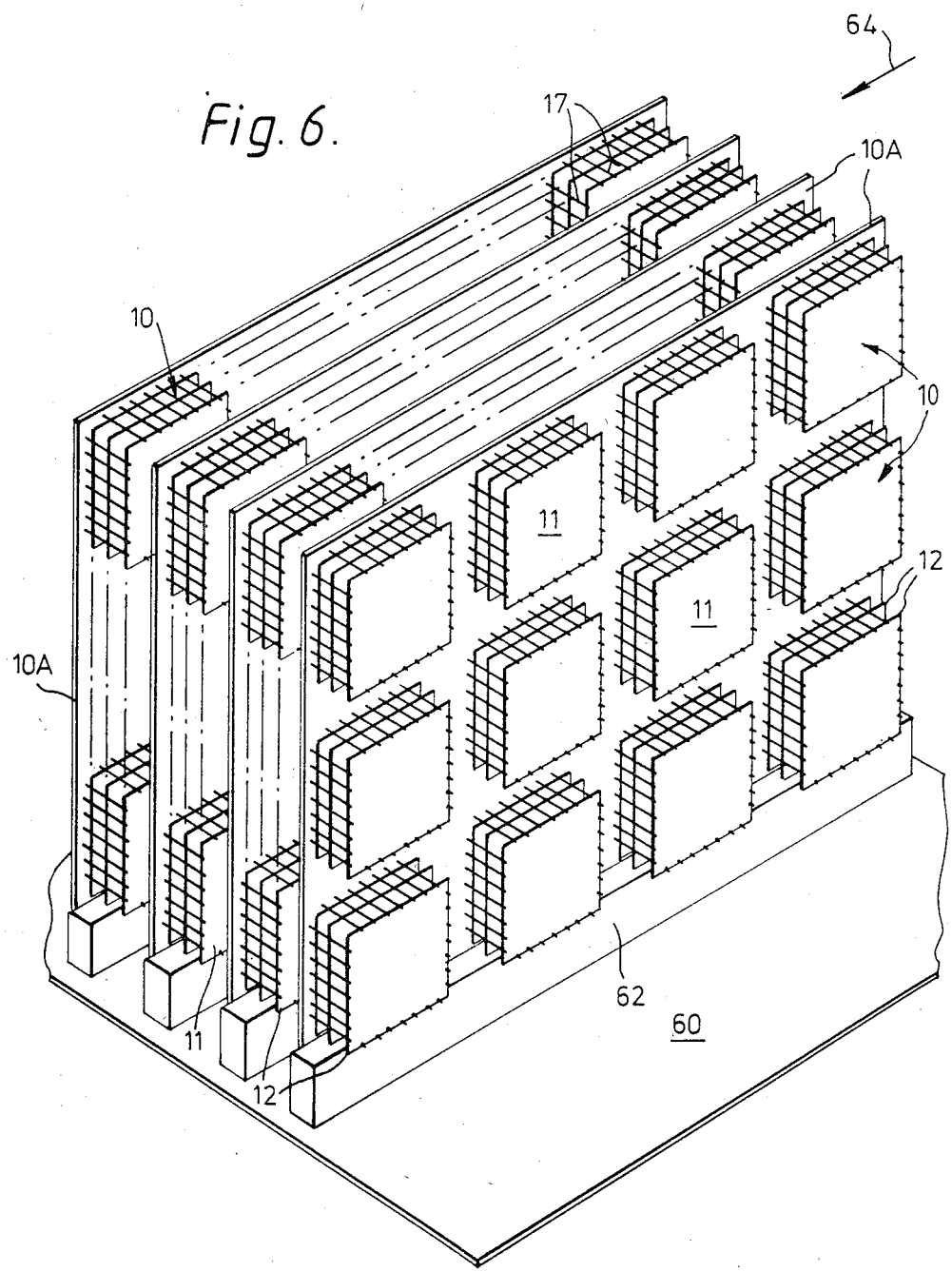
FIG. 6 is a perspective view of a combination of electrical circuit assemblies in accordance with another aspect of the present invention, each constituent electrical circuit assembly being as shown in FIG. 1, and arranged such that a cooling fluid is to flow through the electrical circuit assemblies.

Parts of each constituent less complex electrical circuit assembly of FIG. 6 identical with, or closely resembling, parts of the electrical circuit assembly of FIG. 1, are identified by the same reference numerals in both Figures. For convenience, the components 14 on the modules, the corner pieces 16 of each stack, and the spacing members 17B provided so that the substrates of adjacent stacks are staggered in relation to the cooling fluid flow, all are not shown in FIG. 6. The adjacent stacks of the constituent electrical circuit assemblies, for convenience, are not shown in staggered relationship to each other in FIG. 6, but this feature, shown in FIG. 1, is included within the construction of the combination.

A conventional edge connector 62 is secured individually to each daughter printed circuit board 10A, and each connector has conductor members (not shown) connected both to the terminals provided by the associated daughter printed circuit board, and to co-operating sockets provided by the mother printed circuit board. Thus, the constituent, less complex, electrical circuit assemblies are connected electrically to electrical interconnections provided by the mother printed circuit board, the sockets comprising terminals for the electical interconnections. In this manner there are provided the required electrical interconnections between the constituent, less complex, electrical circuit assemblies to complete a circuit embodied within the combination. in addition, in this way, each daughter printed circuit board is secured to the mother printed circuit board.

The direction of the cooling fluid flow provided to the more complex electrical circuit assembly is indicated by the arrow 64 in FIG. 6, and is generally parallel both to the plane of the mother printed circuit board 60, and to the plane of each daughter printed circuit board 10A, at right angles to the plane of the mother printed circuit board. Hence, the cooling fluid is divided to flow through each constituent less complex electrical circuit assembly, each such part of the cooling fluid flowing sequentially through stacks of the associated less complex electrical circuit assembly. Thus, an efficient use of the cooling fluid provided is made within a combination comprising a more complex electrical circuit assembly constructed in accordance with the present invention.

The mother printed circuit board may not be wholly planar in form, but extends generally in a plane; and it may have any convenient shape in plan.

The mother support may not comprise a printed circuit board; and the required electrical interconnections between the constituent electrical circuit assemblies of the combination may be provided in any convenient manner. The electrical circuit assemblies may be secured to the mother support in any convenient manner.

There may be variations in the constructions of the constituent electrical circuit assemblies of a combination in accordance with the present invention.

What I claim is:

1. An electrical circuit assembly comprising a plurality of stacks on a common, at least generally, planar support, each stack having a plurality of at least substantially identically constructed modules, each such module, at least partially, being held in its required location in the associated stack by a plurality of members extending parallel to the longitudinal axis of symmetry of, and at least wholly along, the stack, each module including an, at least substantially, planar substrate, the substrate extending at right angles to the longitudinal axis of symmetry of the stack, the longitudinal axis of symmetry of each stack being at right angles to the, at least general, plane of the common support, the assembly having constituent elements of a circuit on at least one major surface of each substrate, the circuit being completed by electrical interconnections between the modules of each stack, and between each stack, terminals being provided for each stack of the electrical circuit assembly, and in each stack adjacent pairs of substrates are spaced apart, the arrangement being so that a cooling fluid flows between the adjacent pairs of substrates, through each stack, in planes generally at right angles to the longitudinal axes of symmetry of the stacks, and the cooling fluid flows, sequentially, through at least two of the stacks, and in which, in relation to at least an adjacent pair of stacks of the electrical circuit assembly, the arrangement being such that through both stacks of the adjacent pair the cooling fluid is to flow in turn, the spaced substrates of one stack of the adjacent pair are in staggered relationship to the spaced substrates of the other stack of the adjacent pair.

2. An assembly as claimed in claim 1 having a plurality of at least substantially identically constructed stacks.

3. An assembly as claimed in claim 1 in which circuit elements are provided on only one major surface of each of, at least some of, the substrates in at least one particular stack, and adjacent pairs of such substrates of the particular stack are arranged so that the circuit elements are provided on opposing major surfaces thereof.

4. An assembly as claimed in claim 3 in which the arrangement is such that the cooling fluid is to flow only between alternate pairs of such substrates of a stack.

5. An assembly as claimed in claim 1 in which, for a stack, circuit elements are provided on only one major surface of each of, at least some of, the substrates, and the substrates are of a heat conducting material, said circuit elements being electrically insulated from said heat conducting material, and a heat conducting member is provided on the other major substrate surface, the arrangement being such that the cooling fluid is to flow over the heat conducting member, and extracts heat therefrom, the heat conducting member being so shaped that the cooling fluid is to flow over an extensive surface area thereof.

6. An assembly as claimed in claim 5 in which each heat conducting member is formed with fins.

7. An assembly as claimed in claim 5 and when circuit elements are provided on only one major surface of each of, at least some of, the substrates, and adjacent pairs of such substrates are arranged so that the circuit elements are provided on opposing major surfaces thereof, the heat conducting members provided, on the other major substrate surfaces, of alternate adjacent pairs of such substrates, are interdigitated with each other, forming passages for the cooling fluid therebetween.

8. An assembly as claimed in claim 1 in which circuit elements are provided on both major surfaces of each of, at least some of, the substrates.

9. An assembly as claimed in claim 1 in which each substrate has a rectangular shape and the stack is rectangular shaped in cross section.

10. An assembly as claimed in claim 9 in which members, at least partially, holding the modules in their required locations within the stack, each comprises a corner piece for the stack.

11. An assembly as claimed in claim 9 in which two planar members, at least partially, holding the modules in their required locations within the stack, are provided to prevent the flow of cooling fluid through two associated, opposing, surfaces of the associated stack.

12. An assembly as claimed in any one of the preceding claims, arranged such that the flow of cooling fluid is to be through spaces left between, at least some of, the electrical interconnections between the modules.

13. An assembly as claimed in claim 1 in which the common support comprises a printed circuit board, terminals of each stack being connected electrically to the printed circuit board, the printed circuit board providing the required electrical interconnections between the stacks to complete the circuit.

14. The electrical circuit assembly of claim 1 further comprising a plurality of spacers between one stack of said adjacent pair of stacks and said support, said spacers staggering the substrates of said one stack relative to the substrates of said other stack of said adjacent pair of stacks.

15. A combination of a plurality of electrical circuit assemblies mounted on a common, at least generally, planar mother support, each electrical circuit assembly comprising a plurality of stacks on a common, at least generally, planar support, each stack having a plurality of at least substantially identically constructed modules, each such module, at least partially, being held in its required location in the associated stack by a plurality of members extending parallel to the longitudinal axis of symmetry of, and at least wholly along, the stack, each module including an, at least substantially, planar substrate, the substrate extending at right angles to the longitudinal axis of symmetry of the stack, the longitudinal axis of symmetry of each stack being at right angles to the, at least general, plane of the common support, each assembly having constituent elements of a circuit on at least one major surface of each substrate, the circuit embodied within the combination being completed by electrical interconnections between the modules of each stack, between each stack, and between each electrical circuit assembly, terminals being provided for each stack of each electrical circuit assembly, and for each electrical circuit assembly, and in each stack of each electrical circuit assembly adjacent pairs of substrates are spaced apart, in the combination the plane of the mother support extends at right angles to the, at least generally, planar support of each electrical circuit assembly, the supports of the electrical circuit assemblies extending parallel to each other, the arrangement being such that a cooling fluid provided to the combination is divided to flow, generally parallel to the plane of the mother support, through each electrical circuit assembly, in each electrical circuit assembly the cooling fluid flows between the adjacent pairs of substrates, through each stack, in planes generally at right angles to the longitudinal axes of symmetry of the stacks, and the cooling fluid flows sequentially, through at least two of the stacks, and in which, in relation to at least an adjacent pair of stacks of each electrical circuit assembly, the arrangement being such that through both stacks of the adjacent pair the cooling fluid is to flow in turn, the spaced substrates of one stack of the adjacent pair are in staggered relationship to the spaced substrates of the other stack of th adjacent pair.

16. A combination as claimed in claim 15 in which the mother support comprises a printed circuit board, the terminals of each electrical circuit assembly being connected electrically to the mother printed circuit board, the mother printed circuit board providing the required electrical interconnections between the electrical circuit assemblies to complete the circuit embodied within the combination.

17. A combination as claimed in claim 16 in which a connector is provided individually between each electrical circuit assembly and the mother printed circuit board.

18. A combination as claimed in claim 15 having a plurality of at least substantially identically constructed electrical circuit assemblies.

19. The combination of claim 15 wherein each electrical circuit assembly further comprises a plurality of spacers between one stack of said adjacent pair of stacks and said support, said spacers staggering the substrates of said one stack relative to the substrates of said other stack of said adjacent pair of stacks.

* * * * *